METAL SHIELDING FOR ION IMPLANTED SEMICONDUCTOR DEVICE

Filed Sept. 17, 1968 2 Sheets-Sheet 1

INVENTOR
M. P. LEPSELTER
BY D Caplan
ATTORNEY

United States Patent Office 3,558,366

Patented Jan. 26, 1971

3,558,366

METAL SHIELDING FOR ION IMPLANTED SEMICONDUCTOR DEVICE

Martin P. Lepselter, New Providence, N.J., assignor to Bell Telephone Laboratories, Incorporated, Murray Hill and Berkeley Heights, N.J., a corporation of New York Filed Sept. 17, 1968, Ser. No. 760,161
Int. Cl. H01l 7/54
U.S. Cl. 148—1.5 10 Claims

ABSTRACT OF THE DISCLOSURE

Described herein is a process involving the use of metal masking against ion bombardment in the formation of semiconductor devices. In particular, the metal mask is oxidized in situ, subsequent to the ion bombardment, in order to protect the device. Especially useful for the mask are those metals which expand upon oxidation, in order to protect the edges of the P-N junctions formed by the ion bombardment.

FIELD OF THE INVENTION

Figure 1A:
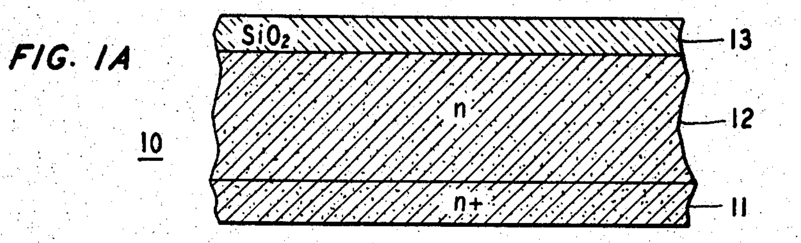

This invention relates to the fabrication of semiconductor devices; in particular, the metal shielding of portions of the surface of the semiconductor during ion implantation and subsequent oxidation of said shields.

BACKGROUND OF THE INVENTION

In the fabrication of semiconductor devices, bombardment of a portion of the surface of the semiconductor with impurity ions can be used to implant said ions therein. Such ion implantation techniques can be utilized as a means for affecting the electrical conductivity and the conductivity type in selected regions of the semiconductor. In order to affect the conductivity by bombardment exclusively at laterally selected portions, use may be made of a patterned metal mask or shield. In planar techniques, for example, this shield may take the form of a deposited apertured layer of relatively heavy metal, such as zirconium, upon the semiconductor surface. However, subsequent to the ion bombardment of the semiconductor through the apertures in the shield, the problem remains as the ultimate disposal of this shield. The electrical conductivity of the shield itself tends to short-circuit the semiconductor devices formed. Likewise, it is difficult to align the apertures in the shields sufficiently precisely so that the P-N junctions formed in the resulting devices are protected from the ambient.

SUMMARY OF THE INVENTION

According to this invention, subsequent to the ion bombardment of the semionductor, the metal layer shield is converted to an insulator, as by oxidation, on the surface of the semiconductor. Thereby, the oxidized metal shield itself contributes to passivation and protection of the underlying semiconductor device. Furthermore, by selecting the metal for the shield from among those metals which expand upon oxidation to a greater volume, the edges of the region formed by the ion bombardment will be protected from the ambient by reason of the lateral expansion of the metal shield. This lateral expansion occurs upon oxidation and tends to reduce the size of any apertures in the shield, thereby protecting the edges and obviating the need for precise alignment of subsequent masks used to complete and protect the device.

In one embodiment of this invention a Schottky barrier diode is fabricated by first forming a platinum silicide type of electrode contact upon a portion of the surface of an N-type silicon body, as known in the art and described in my U.S. Pat. No. 3,274,670 issued on Sept. 27, 1966 for example. The remainder of the silicon surface is protected by a thermally grown silicon oxide layer. Next, a heavy metal zirconium shield with an aperture of somewhat larger diameter than the platinum electrode contact is deposited upon the body, so that the platinum electrode lies inside of the aperture in the shield. The silicon body is then bombarded with gold ions, thereby converting to $\nu$ type (high resistivity n-type) conductivity only that region of the silicon under the aperture, but only in the region beneath the space between the periphery of the platinum electrode and the periphery of the aperture of the shield. During bombardment, the zirconium shield is grounded to provide a protective "Faraday cage" for the body of silicon. Then the shield is oxidized to zirconium oxide in situ. Thereby, what remains is a Schottky diode in the silicon body surrounded by the $\nu$ region, which protects the device from surface states, and which is advantageous for the electric field profile during operation of the diodes as an Impact Avalanche Transit Time device. Specifically, the electric field profile will be such as to induce avalanche breakdown (when desired) under the central portion of the platinum electrode, thereby confining the avalanche to the desired central region of the device.

In another embodiment of the invention, a zirconium metal layer containing apertures is deposited upon the surface of an N-type silicon substrate body which already has been protected by a silicon oxide layer. The substrate body is exposed to a bombardment of acceptor impurity type ions, suh as boron; thereby converting, to a limited depth in the semiconductor, only those regions under the apertures in the zirconium shield to zones of P-type conductivity silicon. Thus, P-N junctions are formed under these apertures. During bombardment the shield is grounded to provide a "Faraday cage" protecting the body. Subsequently, the zirconium layer is oxidized by applications of heat in an oxidizing atmosphere; thereby, the zirconium layer will expand laterally along the surface of the silicon body. In particular, the expansion due to oxidation of the shield as viewed normally to the surface of the silicon body, will cover up ("tuck under") the edges of the P-N junctions, i.e., the intersection of said junctions with the surface of the semiconductor body. Further, the silicon oxide still remaining in the apertures of the zirconium oxide layer may be removed by geometrically selective cathodic back-sputtering techniques, such as described in my U.S. Pat. No. 3,271,286, issued Sept. 6, 1966. Then the apertures may be filled with metal to serve as electrodes and to complete the protection of the device from the ambient without the necessity for close control over alignment.

This invention may be understood better from the following detailed description when read in conjunction with the drawing (not to scale for purposes of clarity) in which:

FIGS. 1A through 1E illustrate a cross section of a Schottky barrier diode device during various stages of fabrication according to a specific embodiment of this invention; and FIGS. 2A through 2D illustrate a cross section of a P-N junction semiconductive device during various stages of fabrication according to another specific embodiment of this invention.

EXAMPLE I

Avalanche Schottky diode

Referring to FIG. 1A, the starting point of the first specific embodiment of this invention is a semiconductor body 10 of silicon which comprises a substrate 11, an epitaxial layer 12, and a protective layer 13. The substrate 11 typically has a thickness of $10^{-2}$ cm., with a very low resistivity in the range of 0.001 to 0.01 ohm cm.; whereas the epitaxial layer 12 has a thickness in the range of 1 to $10\times10^{-4}$ cm., with a relatively high or moderate resistivity in the range of 0.1 to 5.0 ohm cm. In any event, the resistivity of the epitaxial layer 12 is higher than that of the substrate 11, whereas the conductivity type of the epitaxial layer 12 is the same as that of the substrate 11, typically n type as known in the art. Typically, the protective layer 13 is an oxide of silicon 1000 A. thick, which coats the surface of the epitaxial layer 12, also as known in the art. The protective layer 13 is pervious to the ion bombardment to be used later on. Although this example will be further described in terms of a single device, it is obvious that many such devices may be made in a single body of silicon, and may be incorporated in integrated circuit configurations.

Figure 1B:
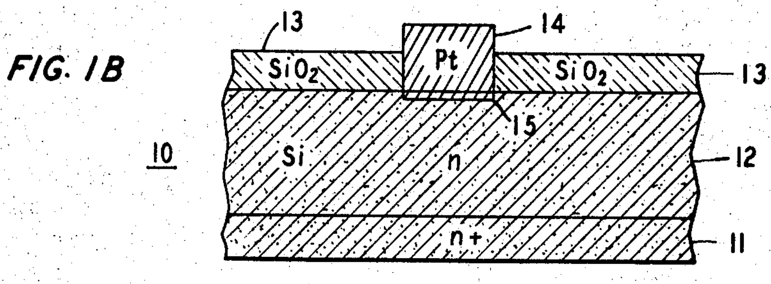

By masking and etching, at least one aperture is made in the oxide layer 13 and an electrically conductive electrode 14 is deposited therein as shown in FIG. 1B. Typically, the electrode 14 is essentially platinum on platinum silicide, as described in my U.S. Pat. No. 3,274,670, issued on Sept. 27, 1966. Thereby a Schottky barrier 15 in the epitaxial layer 12 is formed. The electrode 14 is made of sufficient thickness as to be relatively impervious to the ion bombardment to be described below. Typically, the lateral extent of the electrode 14 is $10^{-2}$ cms. in diameter, while the thickness of the electrode 14 is $10^{-4}$ cms.

Figure 1C:
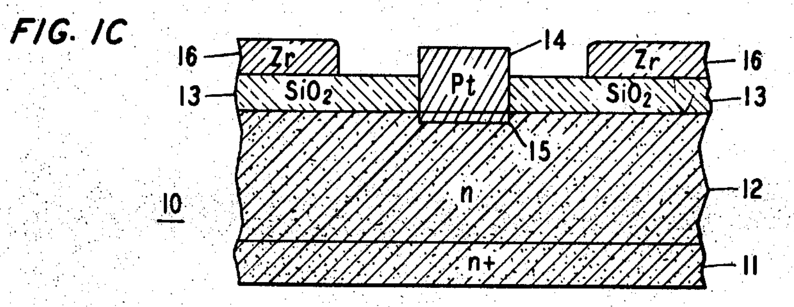

Next a metal layer 16 is formed on the oxide layer 13, as shown in FIG. 1C. The metal used for this layer 16 is typically zirconium having a thickness of at least $5\times10^{-5}$ cm., in order that the metal layer 16 be relatively impervious to the ion bombardment to be described later on. By well-known masking and etching, this layer 16 is provided with an aperture therein typically $1.2\times10^{-2}$ cm. in diameter which is somewhat larger than the diameter of the electrode 14. In any event, this aperture in the layer 16 as viewed from above has a cross section somewhat larger than the cross section of the electrode 14. Thereby the layer 16, as well as the electrode 14, serve as masks against the ion bombardment to be described. Only the space between the electrode 14 and the layer 16 is previous to this ion bombardment.

Figures 1D, 1E:
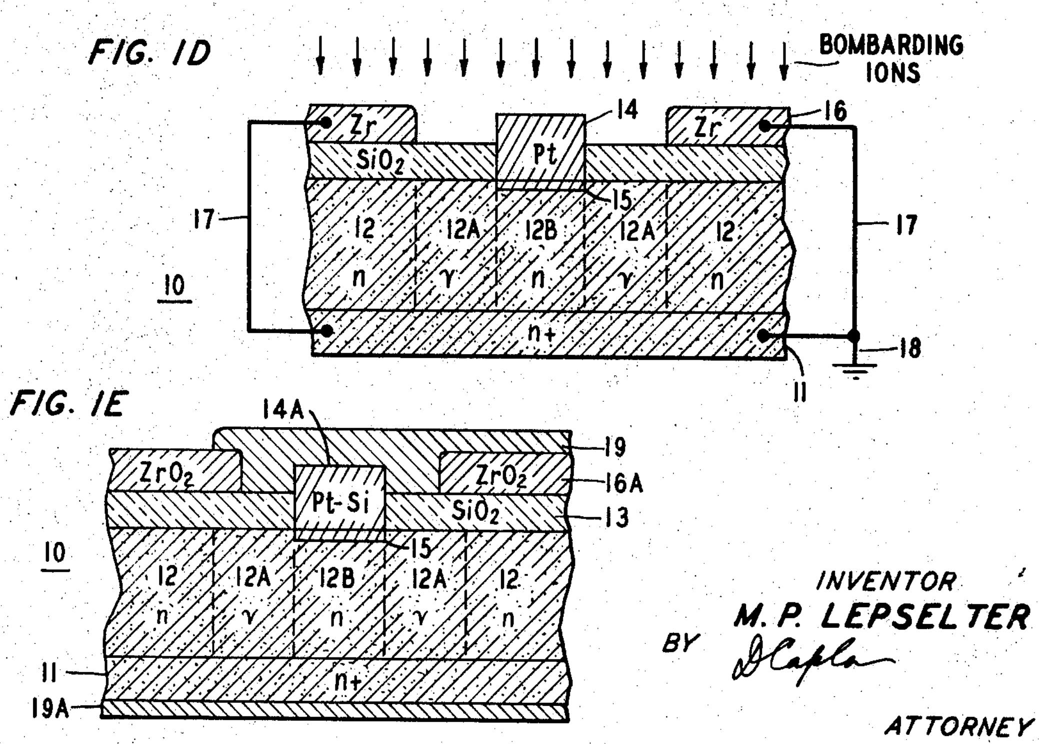

The semiconductor body 10 is subjected to ion bombardment, typically of gold ions having 300 k.e.v. kinetic energy directed toward the surface of the body 10, as indicated by the arrows in FIG. 1D. The flux of gold ions and the bombardment time are such that their arithmetic product is typically of the order of $10^{13}/cm.^2$ in order to convert the bombarded region to $\nu$ type conductivity silicon as known in the art. During the ion bombardment, the metal layer 16 as well as the substrate 11 are both electrically connected by means of lead wires 17 to an electrical ground 18. This electrical connection affords "Faraday cage" type of protection of the oxide layer 13 from electric fields; which would otherwise build up and produce breakdown in the oxide layer 13 during the ion bombardment due to the accumulation of static charge, thereby causing pin holes. Also, after the ion bombardment, the body 10 is heated and annealed in order to reduce any radiation damage caused by the ion bombardment and in order that the implanted gold ions significantly affect the conductivity after implantation. Heating for about 5 to 30 minutes at a temperature in the range of 600° C. to 900° C., as known in the art, is useful for these purposes. Advantageously, this heating is carried out in an oxidizing atmosphere. During the heating, the entire electrode 14 is converted into the platinum-silicide electrode 14A; and the metal layer 16 is oxidized to the insulating layer 16A, an oxide of said metal, as indicated in FIG. 1E.

As a result of the ion bombardment, the hollow cylindrical region 12A beneath the space between the metal layer 16 and the electrode 14A is implanted with ions which significantly affect the conductivity thereat. Thus, directly underneath the aperture in the metal layer 16 (except for the solid cylindrical region 12B underneath the electrode 14A), the implanted gold atoms convert the original n type conductivity of the epitaxial layer 12 into near intrinsic $\nu$ type conductivity. The resistivity of this region 12A typically is in the range of 10 to 1000 ohm cm.; but in any event is significantly higher than the resistivity of the original epitaxial layer 12, in order that the region 12A be relatively insulating as compared with the region 12B.

Finally, the ground wire leads 17 are removed; and metallic electrode contacts 19 and 19A are provided, as known in the art, to complete the device as shown in FIG. 1E. The oxide layer 16A is allowed to remain in place, to protect the surface of the device. Typically, the electrode contact 19A is nickel, as known in the art; and the electrode contact 19 typically is a sandwich type of metallic layer, as described in my Pat. 3,287,612 issued on Nov. 22, 1966. Thus, the device shown in FIG. 1E, as used as an avalanche diode, has an active region extending from the electrode 14, through the barrier layer 15, through the solid cylindrical region 12B of the epitaxial layer 12 bounded by the ion implanted region 12A, through the substrate 11 serving as a terminal zone, to the metallic contact 19A. By reason of the ion implanted near intrinsic region 12A, there are present a minimum of undesirable surface states at the cylindrical boundary of the region 12B. Thus, the hollow cylindrical region 12A defines the boundary of the active region 12B without introducing surface states. Furthermore, in the presence of an applied electrical voltage between the electrodes 19 and 19A the voltage gradient before breakdown is greatest in the *central* portion of the region 12B adjacent the electrode 14. The voltage gradient in the peripheral region 12A, on the other hand, is relatively uniform, because of this region's near intrinsic character (i.e., low concentration of ionizable impurity centers). Thus, avalanche breakdown occurs, as is desirable, in the central region 12B and not in the peripheral region 12A.

Although this example has been described in terms of a silicon semiconductor 10, together with a gold ion implantation process, this semiconductor as well as various other semiconductors may be used in connection with various other ion bombardments, as known in the art. In addition, although this example has been described in terms of an n type conductivity semiconductive silicon substrate 11, it is obvious that p type silicon may be used in conjunction with an appropriate ion bombardment to convert the p type epitaxial silicon to near intrinsic $\pi$ type conductivity in the bombarded region thereof. Likewise, instead of zironium, other metals which form an oxide of high quality insulating characteristics, such as uranium, tantalum and hafnium may be used. Furthermore, metals which do not readily oxidize thermally, such as aluminum, may alternatively be used for the metal mask 16; but in such cases it is important to convert this mask to its oxide (by plasma anodization, for example) prior to the above-mentioned heating and annealing, in order to prevent oxidation of the surface of the platinum-silicide electrode 14A which might otherwise occur.

EXAMPLE II

Self-aligned P-N junction

Figure 2A:
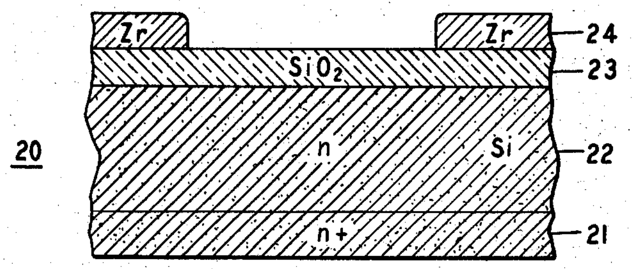

Referring to FIG. 2A, the starting point of another specific embodiment of this invention is a semiconductor body 20 of silicon which comprises a substrate 21, an epitaxial layer 22, and a protective layer 23. The substrate 21 typically has a thickness of $10^{-2}$ cm., with a very low resistivity in the range of 0.01 to 0.001 ohm cm.; whereas the epitaxial layer 22 has a thickness of $2\times10^{-4}$ cm., with a relatively high or moderate resistivity in the range of 0.1 to 1.0 ohm cm. In any event, the resistivity of the epitaxial layer 22 is higher than that of the substrate 21, whereas the conductivity type of the epitaxial layer 22 is the same as that of the substrate 21, typically n type as known in the art. Advantageously, the protective layer 23 is an oxide of silicon, 1000 A. thick, which coats the surface of the epitaxial layer 22, also as known in the art. The protective layer 23 is relatively pervious to the ion bombardment to be used later on. Although this example will be further described in terms of a single device containing but one P-N junction, it is obvious that many such devices may be made in a single body of silcon, an may be incorporated in more complicated devices and integrated circuit cofigurations.

A metal layer 24 is formed on the surface of the protective layer 23. The metal for this layer 24 is selected from those which are relatively impervious to the ion bombardment to follow, and thus may serve as a shield against this ion bombardment. Advantageously, this metal should also be selected from among those which expand upon oxidation and which form an oxide of high quality insulating characteristics. Typically zirconium is used for the metal in the layer 24, although uranium, tantalum an hafnium may also be used for this layer 24.

The thickness of the metal layer 24 is typically one micron or more, sufficient in any event to be relatively impervious to the ion bombardment to follow. By well-known masking and etching techniques, the metal layer 24 is provided with at least one aperture therein, typically $10^{-2}$ cm. in diameter as shown in FIG. 2A.

Figure 2B:
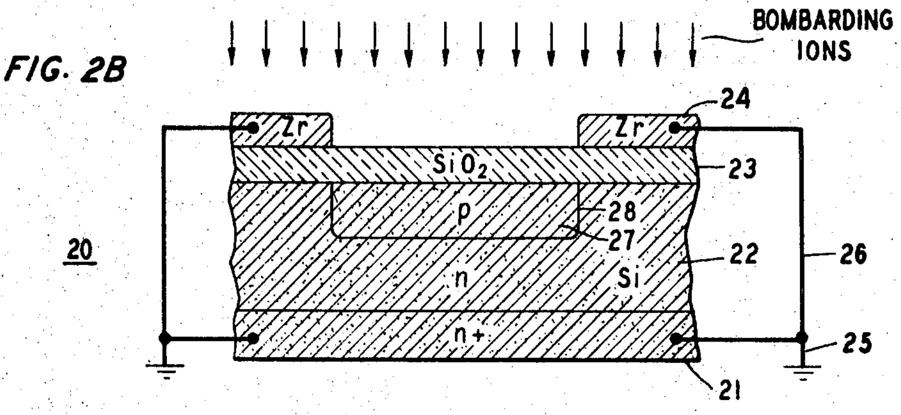
Figure 2C:
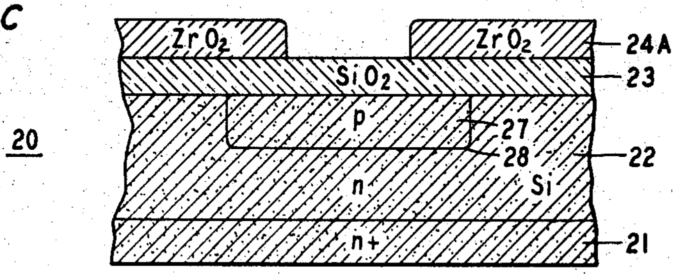

The silicon semiconductor body 20 is then subjected to the ion bombardment, typically of boron ions having 300 k.e.v. kinetic energy directed toward the surface of the semiconductor body 20, as indicated by the arrows in FIG. 2B. The bombardment time depends upon the flux of boron ions and the desired conductivity in the bombarded region, as known in the art. During the ion bombardment the metal layer 24 as well as the substrate 21 are both electrically connected to an electrical ground 25 by means of lead wires 26. This electrical connection affords "Faraday cage" type of protection of the oxide layer 23 from electric fields, which would otherwise build up therein and cause breakdown during the ion bombardment due to accumulation of static charges. Such breakdown would cause undesirable pin holes. Also, after the ion bombardment, the body 20 is heated and annealed in order to reduce any radiation damage caused by the ion bombardment and in order that the boron ions create a zone of p type conductivity in the semiconductor body 20 after implantation therein, as known in the art. Heating for about 5 minutes to 30 minutes at a temperature in the range of 600° C. to 900° C. typically is useful for this purpose, also as known in the art. Advantageously, this heating is carried out in an oxidizing atmosphere in order to oxidize the metal layer 24 to the metal oxide layer 24A, as indicated in FIG. 2C.

As a result of the ion bombardment, the solid cylindrical region 27 of the semiconductor is converted to a zone of p type conductivity silicon semiconductor; thereby a P-N junction 28 is formed in the epitaxial layer 22, as indicated in FIG. 2B. Furthermore, as a consequence of the aforementioned choice of metal for the original metal layer 24, namely that it expand upon oxidation, the cross section of the aperture in the metal oxide layer 24A will be smaller than the original size of the cross section of the aperture in the metal layer 24. Thus, the intersection of the P-N junction 28 with the protective layer 23 (the "edge" of the junction 28) lies vertically beneath the metal oxide layer 24A in a region which is outside of the vertical projection of the aperture in this layer 24A, as indicated in FIG. 2C.

Figure 2D:
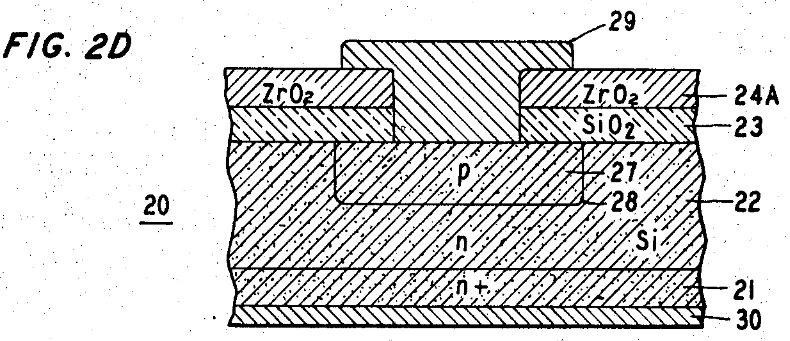

Finally, the lead wires 26 are removed and the portion of the protective layer 23 still lying in the aperture of the metal oxide layer 24A is removed, for example, by the process of cathode back-sputtering described in my U.S. Pat. No. 3,271,286, issued on Sept. 6, 1966. The metal oxide layer 24A automatically ensures the removal by back-sputtering of only that portion of the protective layer 23 lying in the aperture. An electrode contact 29 is then deposited in the aperture and in physical contact with the surface of the p type conductivity region 27 of the epitaxial layer 22, as indicated in FIG. 2D. This electrode 29 may be somewhat complicated, as described for example in my U.S. Pat. No. 3,287,612 issued on Nov. 22, 1966. Also, as indicated in FIG. 2D, an electrode contact 30 typically nickel, is plated on the surface of the substrate 21. Thereby, a P-N junction diode device is formed in which the intersection of P-N junction 28 with the surface of the semiconductor body 20, i.e., the edge of the P-N junction 28, is "tucked under" the protective layer 23 and the oxide layer 24A, and is thereby protected from the ambient. This advantageous alignment automatically results from the expansion of the layer 24 as it is oxidized to the layer 24A, without the need for precise control over the registry of any masks which would otherwise be required.

Although this example has been described in terms of a silicon semiconductor body 20, together with a boron ion implantation process to make a P-N junction diode device, it should be obvious that this semiconductor, as well as various other semiconductors, may be used in conjunction with various other and further ion bombardments, as known in the art. In this way, more complicated devices such as transistors may be fabricated.

While this invention has been described in terms of specific embodiments, it is obvious that many modifications are possible within the scope of the invention.

What is claimed is:

1. In a method of fabricating a semiconductive device by means of an ion bombardment of at least a portion of the surface of the semiconductor selectively protected by a metal mask against ion implantation in said semiconductor, the step which comprises converting said mask to an insulator subsequent to the step of said ion bombardment and allowing said mask to remain in place in order to protect the device.

2. The method of fabricating a semiconductor device by means of bombarding with ions which comprises the steps of:

(a) forming a metal mask provided with an aperture on the surface of the semiconductor, said metal being oxidizable to an oxide which occupies a greater volume than the metal itself, said metal mask being impervious to said bombarding with ions;

(b) bombarding the surface of the semiconductor with ions, in order to implant said ions into the semiconductor in the region underneath the aperture in the metal mask; and (c) oxidizing the metal mask, thereby causing the cross section of said aperture to decrease, thereby to cover the edge of the region previously underneath the aperture in the metal mask.

3. The method of claim 2 in which the mask is electrically grounded during the bombarding step.

4. The method of claim 2 in which the metal mask is essentially zirconium.

5. The method of claim 2 in which the metal mask is essentially a member of the group consisting of zirconium, hafnium and uranium.

6. The method of claim 2 in which is further provided the step of coating the surface of the semiconductor with a protective layer which is pervious to the bombarding with ions, prior to the step of forming the metal mask.

7. The method of claim 6 which includes the further step of removing at least a first portion of the said protective layer situated in said aperture subsequent to the step of oxidizing the metal mask, thereby exposing a first portion of the semiconductor.

8. The method of claim 7 which includes the further step of depositing an electrically conductive material on said first portion of the semiconductor in order to make contact with the semiconductor thereat.

9. The method of fabricating a semiconductive device, which comprises the steps of:

(a) forming a metal mask provided with an aperture on the surface of the semiconductor, said metal being oxidizable to an oxide which occupies a greater volume than the metal itself, said metal mask being impervious to an ion bombardment, said semiconductor being of a first conductivity type in the region of the semiconductor underneath the aperture;

(b) bombarding the surface of the semiconductor with ions, in order to implant said ions into the semiconductor in the region underneath the aperture in the metal mask, whereby said ions convert a portion of the said region into a second conductivity type which is opposite to said first conductivity type; and (c) oxidizing the metal mask, thereby causing said aperture to decrease in cross section.

10. The method of making a semiconductor device including the steps of:

(a) forming a first aperture in an oxide coating on the surface of the semiconductor, said oxide coating being pervious to an ion bombardment, said semiconductor having a first conductivity type zone in a first region underneath said coating;

(b) depositing a metal electrode in said aperture in contact with said semiconductor, said electrode having a sufficient thickness such that said electrode be impervious to the ion bombardment;

(c) forming a metal mask on the oxide coating, said mask being of a thickness sufficient to be impervious to the ion bombardment and said mask having a second aperture therein which contains the metal electrode, the second aperture being larger than the first aperture, thereby leaving a space on said oxide coating between the metal electrode and the periphery of the second aperture in the mask;

(d) bombarding the semiconductor with ions to implant them into the semiconductor in a second region therein underneath the space between the metal electrode and the periphery of the second aperture in the mask, thereby converting the second region to semi-intrinsic or intrinsic conductivity;

(e) oxidizing the metal mask and allowing it to remain in place.

References Cited

UNITED STATES PATENTS

| | | | |
|---|---|---|---|
| 3,431,150 | 3/1969 | Dolan, Jr., et al. ----- | 148—1.5 |
| 3,442,701 | 5/1969 | Lepselter ----------- | 117—212 |

L. DEWAYNE RUTLEDGE, Primary Examiner

R. A. LESTER, Assistant Examiner

U.S. Cl. X.R.

29—578; 117—212; 148—186